United States Patent [19]
Ahmed et al.

[11] Patent Number: 5,614,771
[45] Date of Patent: Mar. 25, 1997

[54] EXTENDED HIGH VOLTAGE SCR SWITCH

[75] Inventors: Iftikhar Ahmed, Bellflower; Steven A. Buhler, Redondo Beach, both of Calif.

[73] Assignee: Xerox Corporation, Stamford, Conn.

[21] Appl. No.: 579,514

[22] Filed: Dec. 27, 1995

[51] Int. Cl.$^6$ .................................................. H01H 19/64
[52] U.S. Cl. ........................ 307/113; 327/401; 327/438; 327/439; 327/460; 327/470; 327/471; 327/483; 327/464
[58] Field of Search ..................................... 327/401, 438, 327/439, 460, 470, 471, 453, 464

Primary Examiner—William M. Shoop, Jr.
Assistant Examiner—Kim Lockett
Attorney, Agent, or Firm—Nola Mae McBain

[57] ABSTRACT

A high voltage switch in which an extended SCR is built in an insulated polysilicon layer for providing a single structure high voltage switch. The high voltage SCR is built by building unit SCRs comprising a cathode, a gate, an anode and a voltage sustaining area. The unit SCRs are built as horizontal linear devices. The unit SCRs can then be combined to form a large SCR by building each unit SCR so that the anode of one SCR is at least partially contiguous with the cathode of the next unit SCR.

12 Claims, 4 Drawing Sheets

EXTENDED HIGH VOLTAGE SCR SWITCH

BACKGROUND

This invention relates generally to silicon controlled rectifier (SCR) devices and more particularly concerns a high voltage switch that is built laterally in a polysilicon layer deposited above other microelectronic devices.

Devices, such as stacked or cascaded transistors, have been used to turn on extremely high voltages, however structures of this type are inherently long, consume large amounts of silicon and have reliability problems. There has not been a single device that can be used to turn on extremely high voltages for example, voltages of 20,000 volts or more.

Conventional SCRs can be used as specialized switches. One important aspect of designing SCRs is that there is no upward limit on the number of p-n junctions which can be combined to form an SCR device. Increasing the number of p-n junctions in an SCR allows design of a single high voltage device that can be used as a switch.

New processing technologies have led to the development of an ability to build a reasonably good SCR device in layers above that of transistors built within substrate layers of a wafer. Utilizing SCR characteristics to build a single device as a high voltage switch and then building the SCR in the layers above that of conventional transistors has led to the development of a single high voltage switch that does not use the large quantities of area required for conventional high voltage switches.

Accordingly, it is the primary aim of the invention to provide a single high voltage device capable of switching high voltages and not requiring large quantities of silicon area.

Further advantages of the invention will become apparent as the following description proceeds.

SUMMARY OF THE INVENTION

Briefly stated and in accordance with the present invention, there is provided a silicon controlled rectifier which is built on a substrate that has been covered with an insulating layer. A layer of polysilicon is deposited on the insulating layer, and the silicon controlled rectifier is built in the polysilicon layer. The gate, cathode, anode, and a voltage sustaining area make up the silicon controlled rectifier and they are linearly arranged such that the cathode is on one end, the gate is contiguous to the cathode, the voltage sustaining area is contiguous to the gate, and terminates with the anode, with the anode contiguous to the voltage sustaining area and on the other end.

There is also provided a high voltage SCR switch that is an electrical series of multiple unit SCRs. Each unit SCR comprises a cathode region, a gate region, an anode region and a voltage sustaining area. These regions are linearly arranged such that the cathode regions is on one end, the gate region is contiguous to the cathode region, the voltage sustaining area is contiguous to the gate region, and the unit SCR terminates with the anode region, the anode region being contiguous to the voltage sustaining area and on the other end. Also part of the high voltage SCR switch are multiple resistors forming a resistor voltage divider network.

Figure 1:
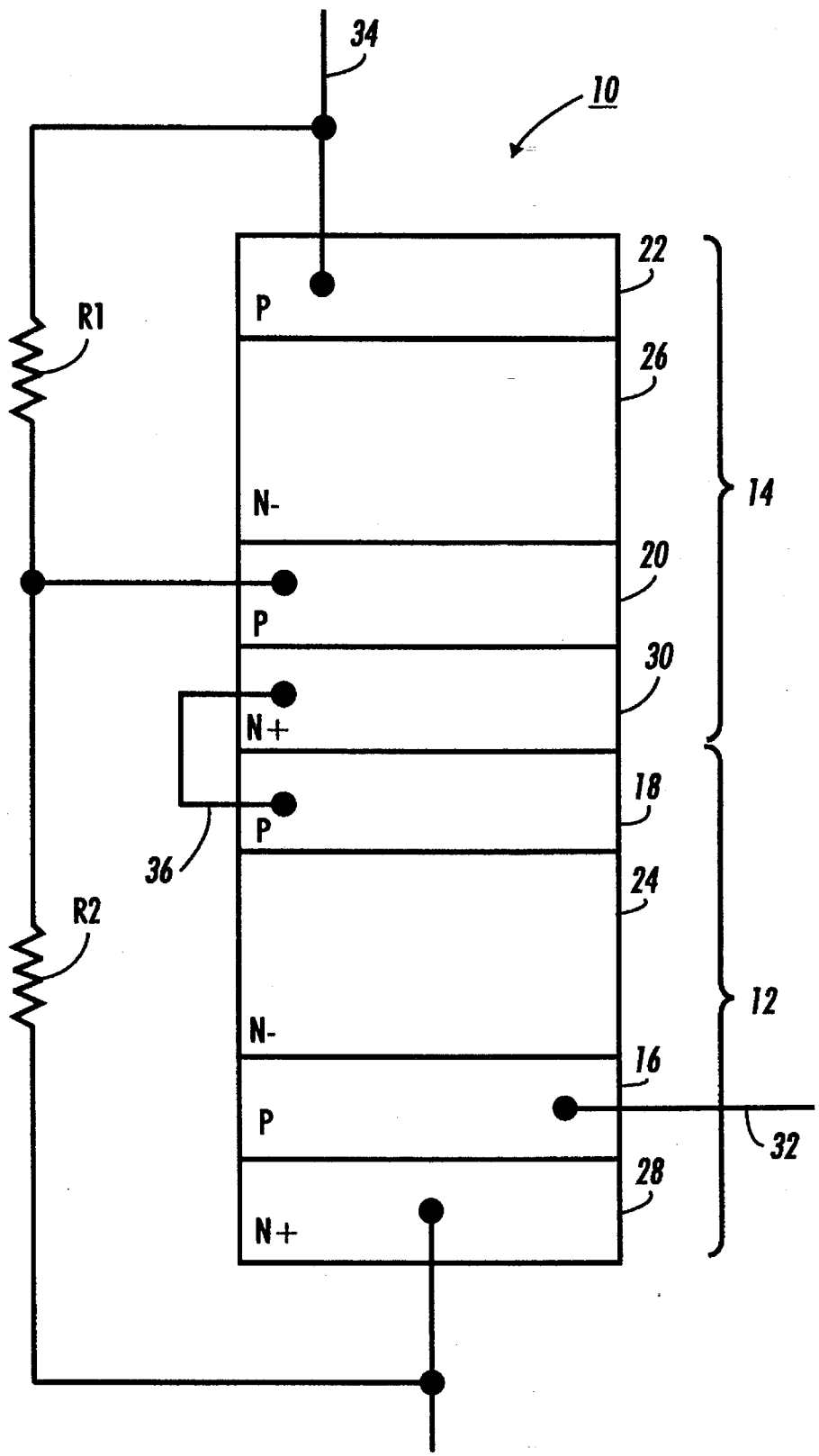
FIG. 1 shows a schematic of a high voltage SCR switch utilizing two unit SCR blocks.

While the present invention will be described in connection with a preferred embodiment and method of use, it will be understood than it is not intended to limit the invention to that embodiment or procedure. On the contrary, in is intended to cover all alternatives, modifications and equivalents as may be included within the spirit and scope of the invention as defined by the appended claims.

Alpha-Numeric List of Elements length L
resistor R1
resistor R2
resistor R10
resistor R12
resistor R14
resistor R16
SCR-switch 10
unit SCR 12
unit SCR 14
gate p type area 16
anode p type area 18
gate p type area 20
anode p type area 22
voltage sustaining area 24
voltage sustaining area 26
cathode n+ type area 28
cathode n+ type area 30
line 34
line 36
high voltage SCR switch 40
unit SCR 42
unit SCR 44
unit SCR 46
unit SCR 48
gate 50
gate 52
gate 54
cathode 58
cathode 60
cathode 62
anode 64
anode 66
anode 68
voltage sustaining area 70
voltage sustaining area 72
node 74
substrate 80
insulating layer 82
polysilicon 84
oxide 86

DETAILED DESCRIPTION OF THE INVENTION

SCRs have been known and used in power and switching circuits since the late 1960's. SCR theory and the operation of SCRs is well know. The SCR switch discussed in this application does not operate substantially differently from SCR theory, therefore attention will be focused on the design, layout, and processing parameters which enable this disclosed SCR to be used as a single device capable of switching high voltages and not requiring the use of additional silicon area to be fabricated as part of a circuit.

Turning now to FIG. 1 a schematic of an SCR switch 10 is shown. The SCR switch 10 has two unit SCRs 12, 14. Each unit SCR 12, 14 is composed of two p type areas 16, 18, 20, 22 alternating with either a voltage sustaining area 24, 26 or a n+ type area 28, 30.

Line 32 is an electrical connection to the p type area 16 that is the gate of the unit SCR 12. This is the p type area interposed between the voltage sustaining area 24 and the n+ type area 28 of unit SCR 12. The other p type area 18 is the anode of the unit SCR 12. The n+ type area 28 is the cathode of the unit SCR 12.

The p type area 20 is the gate of the unit SCR 14. The p type area 22 is the anode of the unit SCR 14 and the n+ type area 30 is the cathode of the unit SCR 14.

Line 34 is a voltage source line for the SCR switch 10. It is connected in parallel to the anode (p type area 22) of the unit SCR 14 and to a resistor R1. The other end of the resistor R1 is connected in parallel to the gate (p type area 20) of the unit SCR 14 and to a resistor R2. The other end of resistor R2 is connected to the cathode (n+ type area 28) of the unit SCR 12. The resistors R1 and R2 form a voltage divider to divide the supply voltage on line 34 between the two unit SCRs 12, 14.

Unit SCR 12 is electronically connected directly to unit SCR 14 by connecting the anode (p type area 18) of unit SCR 12 to the cathode (n+ type area 30) of unit SCR 14 through line 36.

Figure 2:
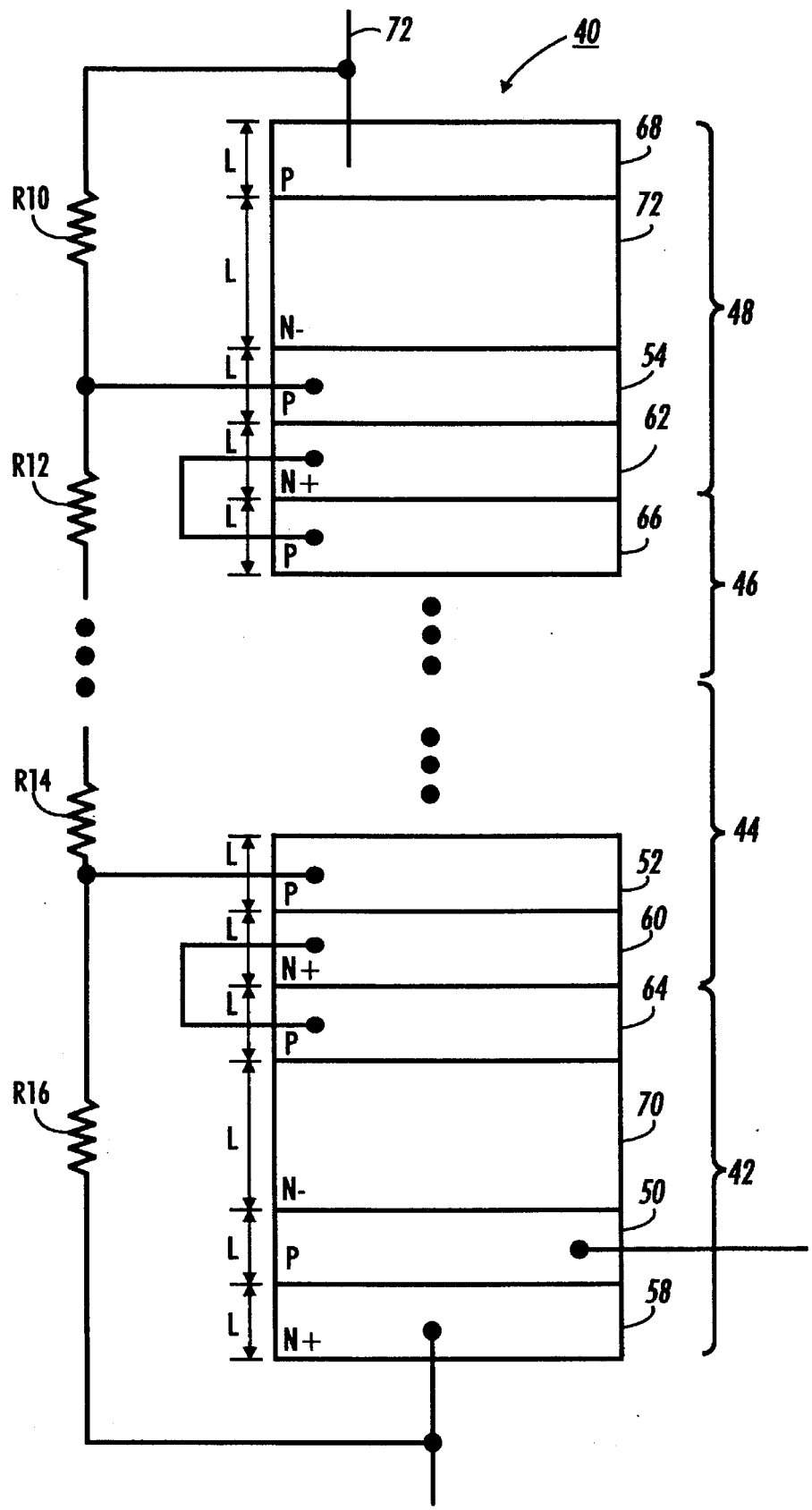
FIG. 2 shows a schematic of a high voltage SCR switch utilizing a multiple number of unit SCR blocks.

FIG. 1 shows how two unit SCRs 12, 14 may be connected together along with a voltage divider network to allow each unit SCR 12, 14 to share the total voltage and increase the voltage capability of the resultant SCR switch 10. However, this technique is not limited to using just two unit SCRs. FIG. 2 shows an example of multiple unit SCRs connected to for a single high voltage switch.

In FIG. 2 a high voltage SCR switch 40 is shown. It is comprised of an n number of unit SCRs 42, 44, 46, 48 where unit SCR 42 is the first unit SCR, unit SCR 44 is the second unit SCR, unit SCR 46 is the nth−1 unit SCR and unit SCR 48 is the nth or last unit SCR. The two unit SCRs 42, 48 are shown in their entirety but unit SCRs 44, 46 are only partially shown to illustrate how multiple unit SCRs may be used to form one single SCR switch.

Each unit SCR, as discussed above, has a gate and shown is gate 50 for unit SCR 42, gate 52 for unit SCR 44 and gate 54 for unit SCR 48. Each unit SCR has a cathode and shown is cathode 58 for unit SCR 42, cathode 60 for unit SCR 44 and cathode 62 for unit SCR 48. Each unit SCR has an anode and shown is anode 64 for unit SCR 42, anode 66 for unit SCR 46, and anode 68 for unit SCR 48. Each unit SCR also has a remaining voltage sustaining area and shown is the voltage sustaining area 70 for unit SCR 42 and voltage sustaining area 72 for unit SCR 8. A source voltage will be applied to the high voltage SCR switch 40 at node 74.

A voltage divider network comprised of an n number of resistors is also shown. Resistor R16 is the first resistor, resistor R14 is the second resistor, resistor R12 is the nth−1 resistor and resistor R10 is the nth or last resistor. Note that in this configuration, that however many n unit SCRs there are, there are an equal n number of resistors in the voltage divider network.

The first resistor R16 is always attached to the cathode 58 of the first unit SCR 42 on one end and to the gate 52 of the second unit SCR 44 on the other end. The second resistor is attached to the gate 52 of the second unit SCR 44 on one end and the gate of the next unit SCR on the other end. That is, with the exception of the first and last (or nth) resistors, any ith resistor is attached between the gates of the ith and ith+1 unit SCRs. The last or nth resistor R10 is attached between the gate 54 of the last or nth unit SCR 48 and the anode 68 of the last or nth unit SCR 48.

The design of the resistors R16, R14, R12, R10 is important to proper functioning of the high voltage SCR switch 40. The resistors R16, R14, R12, R10 need to be designed so that any current flowing through them is low enough to prevent turn on when the gate 50 is grounded and the voltage is ramped up but also with sufficient current to turn on the gate 50 when the high voltage SCR switch is being used in normal operation. This means that the resistance needed will be a relatively large value but it is important to remember that it is the current density that is important in the functioning of the high voltage SCR switch 40 and the current density is a function of the physical device sizes.

Example sizes for the high voltage SCR switch 40 are resistor (R10, R12, R14, R16) values of $10^8$ ohms, with device lengths L of the gates 50, 52, 54, cathodes 58, 60, 62, and anodes 64, 66, 68 in the range of 3 to 10 microns. The device length L of the remaining voltage sustaining areas 70, 72 should be in the range of 10 to 50 microns. With a source voltage of 1000 volts applied at node 74 there will be a current of 10 microamps flowing through each resistor R10, R12, R14, R16. With device lengths of approximately 10 microns, the current density will be approximately 1 microamp per micron in width with should be sufficient for operating the high voltage SCR switch 40. However, these are merely example sizes for one high voltage SCR switch to illustrate a sample design. Actual values will vary depending on the size of the high voltage SCR switch used.

Figure 3:
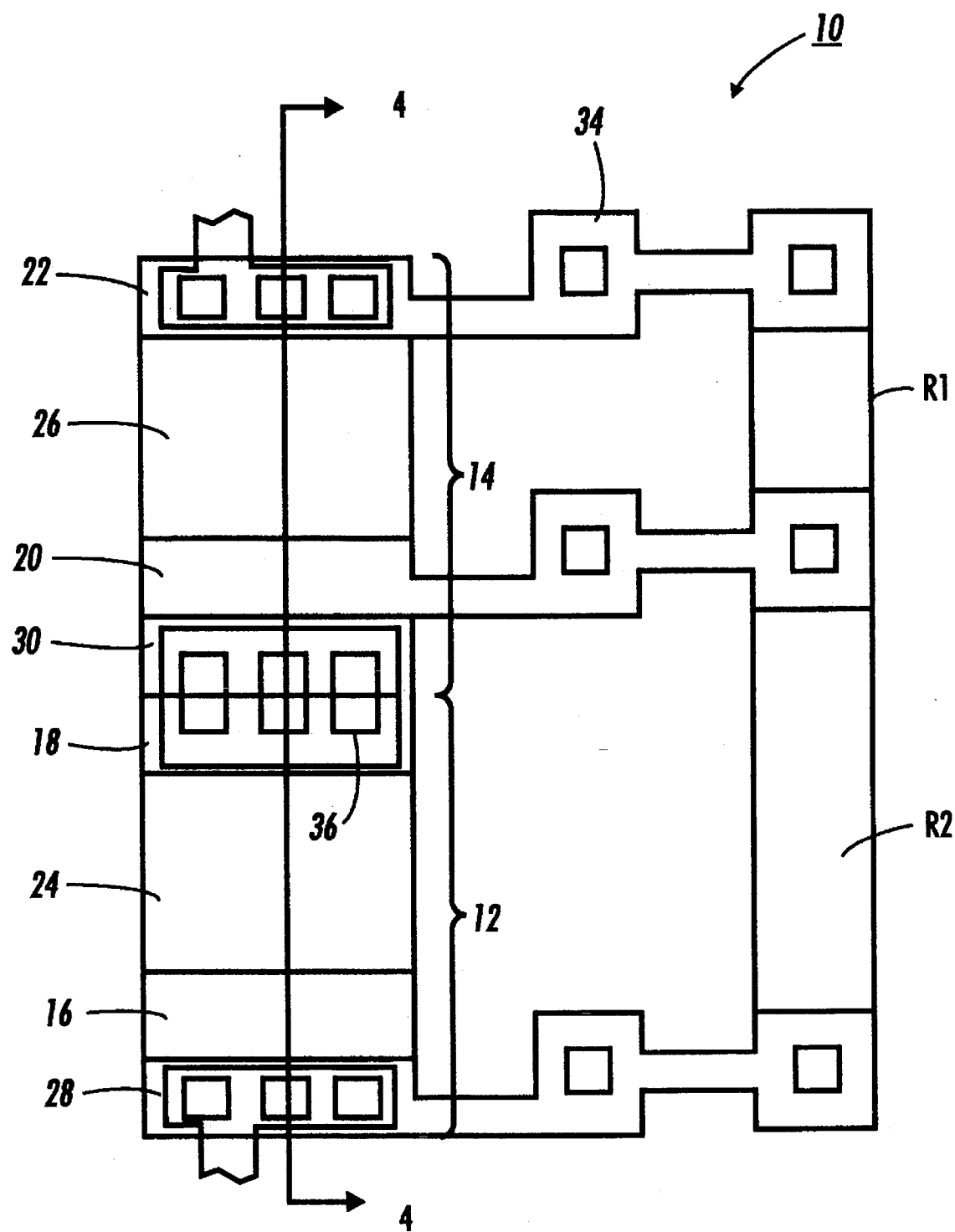
FIG. 3 shows a top view of a layout of the SCR shown in FIG. 1.
Figure 4:
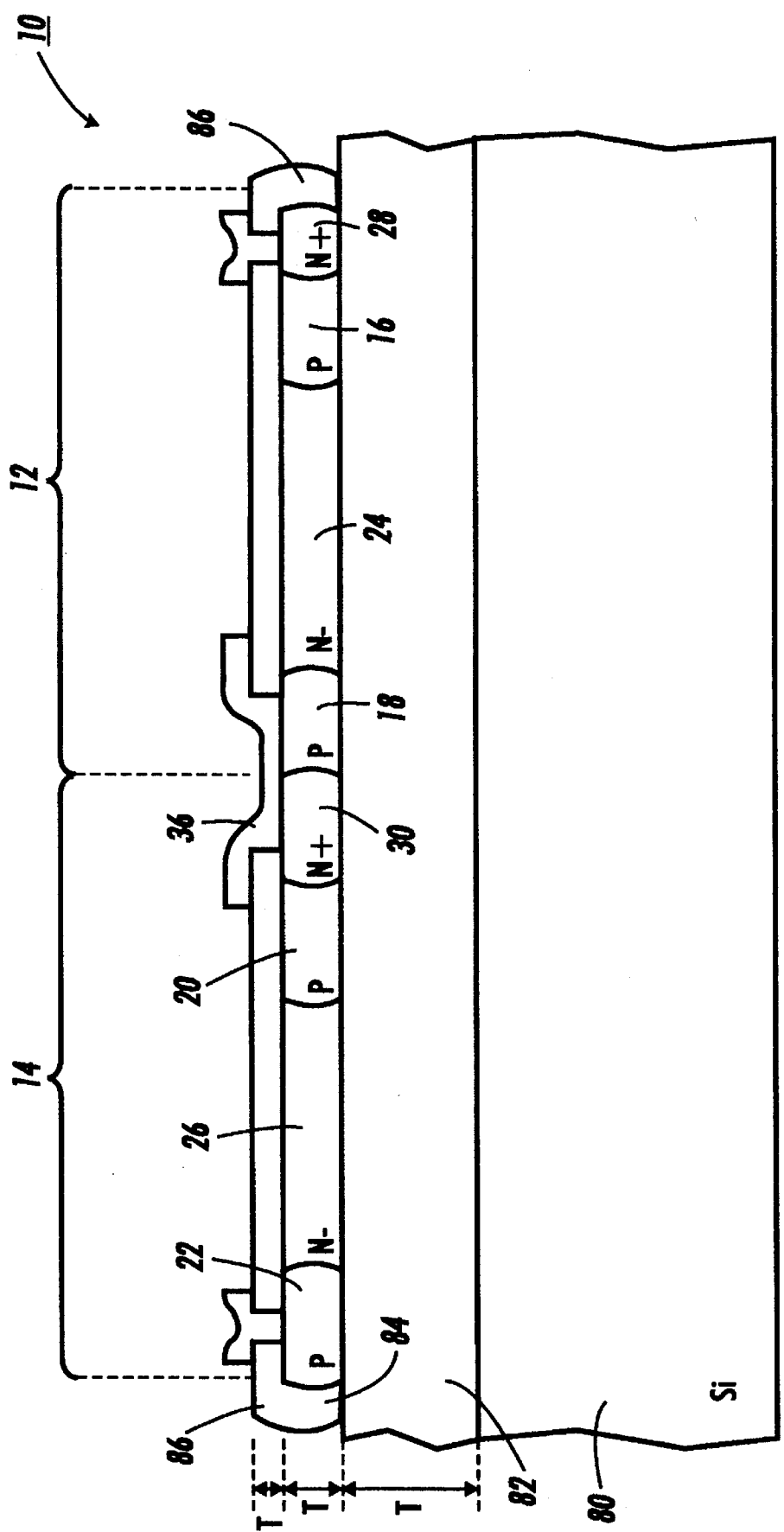
FIG. 4 shows a cross-section of the layout shown in FIG. 3 taken through cross-section line 4—4.

FIG. 3 shows a top view of a layout of the high voltage SCR switch 10 shown in FIG. 1. FIG. 4 shows a cross section of the layout of the high voltage SCR switch taken through line 4—4 shown on FIG. 3. The process techniques are well known within the art of semiconductor processing so discussion will focus on materials and final structure of the high voltage SCR switch.

The high voltage SCR switch is built on a substrate 80. The substrate 80 in this example is a plain silicon wafer, however the substrate 80 could be a variety of things including a preprocessed silicon wafer containing other semiconductor devices, glass, sapphire, quartz or ceramic.

A thick insulating layer 82 is formed on top of the substrate 80 if a silicon wafer is used for the substrate 80. If glass, sapphire, ceramic, or quartz is used for the substrate 80 then the insulating layer 82 may be omitted. The thick insulating layer 82 is to provide an isolation layer between the substrate 80 and the high voltage SCR switch 10. The insulating layer 82 should be approximately from 1–2 microns thick or thicker to provide the necessary insulation from the high voltages used in the high voltage SCR switch. The necessary minimum thickness of the insulating will vary with the actual voltages expected with a thicker insulating layer 82 being needed for higher voltages. For very high voltage applications, those greater than 2000 volts, it is anticipated that it will not possible to provide a thick enough insulating layer to adequately isolate the substrate 80 from the high voltage SCR switch. In these cases, the appropriate choice of substrate 80 is glass, quartz, ceramic, sapphire or other material that does not require an isolation layer. A variety of good insulators can be used to make the insulating layer 82 including oxide, nitride and oxynitride layers.

The high voltage SCR switch 10 is built in a layer of polysilicon 84 on top of the insulating layer 82. The polysilicon 84 should be from approximately 0.2–1.0 microns thick. If the polysilicon becomes thinner, the requisite free charge density needed for the high voltage SCR switch 10 to work will not be present. The polysilicon 84 receives a low blanket implant, using conventional techniques, of phosphorus giving it an n-type concentration. Suitable concentrations range from $1.0 \times 10^{18}$ per cubic centimeter to $1.0 \times 10^{14}$ per cubic centimeter with an optimal concentration in the vicinity of $10^{15}$ per cubic centimeter. Using a blanket implant to provide an n-type concentration to the entire polysilicon 84 is used for ease of processing and to reduce the number of masking steps used. The voltage sustaining areas, could be created with conventional masking and implanting techniques.

The p type areas 16, 18, 20, 22 are built in the polysilicon 84 using conventional masking and implant techniques. In this process the use of a blanket n-type implant puts some constraints on the concentrations of dopant used to create the p type areas 16, 18, 20, 22. It requires that the concentrations used to create the p type areas be greater than the concentrations used in the blanket implant. Suitable concentrations range from approximately $10^{17}$ to $10^{19}$ per cubic centimeter.

The n+ type areas 28, 30 are created using conventional masking and an additional n type implant to create a resultant concentration of approximately from $10^{19}$ to $10^{20}$ per cubic centimeter. The concentration of the result n+ type areas 28, 30 should be greater than the concentrations of the p type areas 16, 18, 20, 22.

A thin layer of oxide 86 is grown on top of the polysilicon 84 to protect the high voltage SCR switch 10. The line 36 connecting the n+ type area 30 and the p type area 18 is implemented using a metal connection through a space in the oxide 86.

We claim:

1. A high voltage SCR switch comprising:
   a) an electrical series comprised of two unit SCRs, one of the two unit SCRs being a first unit SCR and the other unit SCR being a second unit SCR, where each unit SCR comprises a cathode, a gate, an anode and a voltage sustaining area,
   b) a voltage source node,
   c) first and second resistors, each resistor having a first and second end,
   d) the cathode of the first unit SCR being electrically connected to the first end of the first resistor,
   f) the anode of the first unit SCR being electrically connected to and at least partially contiguous with the cathode region of the second unit SCR,
   g) the gate of the second unit SCR being electrically connected to the second end of the first resistor and the first end of the second resistor, and
   h) the anode of the second unit SCR being electrically connected to the second end of the second resistor and the voltage source node.

2. The high voltage SCR switch of claim 1 wherein each unit SCR generally extends linearly and has two ends.

3. The high voltage SCR switch of claim 2 wherein each unit SCR further comprises the cathode, gate, voltage sustaining area, and anode being generally linearly arranged such that the cathode is on one end, the gate is at least partially contiguous with the cathode, the voltage sustaining area is at least partially contiguous with the gate and the unit SCR terminates at the other end with the anode that is at least partially contiguous to the voltage sustaining area.

4. The high voltage SCR switch of claim 3 wherein the two unit SCR's, the first resistor, and the second resistor further comprise:
   a) a substrate with an upper surface,
   b) an insulating layer on the upper surface of the substrate, and
   c) a polysilicon layer on the insulating layer wherein the cathode, gate, voltage sustaining area, anode, first resistor, and second resistor are located.

5. A high voltage SCR switch comprising:
   a) an electrical series comprised of at least three unit SCRs, one of the unit SCRs being a first unit SCR and another of the unit SCRs being a last unit SCR, where each unit SCR comprises a cathode, a gate, an anode and a voltage sustaining area,
   b) a voltage source node,
   c) at least three resistors, one of the resistors being a first resistor and another the resistors being a last resistor, each resistor having a first end and a second end, and each resistor being associated with a single unit SCR to form a resistor-unit SCR pair such that the first resistor is associated with the first unit SCR to form a first resistor-unit SCR pair and the last resistor is associated with the last unit SCR to form a last resistor-unit SCR pair,
   d) the cathode of the first unit SCR being electrically connected to the first end of the first resistor,
   e) the anode of the each unit SCR other than the last unit SCR being electrically connected to and at least partially contiguous with the cathode of the succeeding unit SCR in the electrical series,
   f) the gate of each unit SCR other than the first unit SCR being electrically connected to the second end of the resistor in the preceding resistor-unit SCR pair in the electrical series and the first end of the resistor associated with the unit SCR, and
   g) the anode of the last unit SCR being electrically connected to the second end of the last resistor.

6. The high voltage SCR switch of claim 5 wherein each unit SCR generally extends linearly and had two ends.

7. The high voltage SCR switch of claim 6 wherein each unit SCR further comprises the cathode, gate, voltage sustaining area, and anode being generally linearly arranged such that the cathode is on one end, the gate is at least partially contiguous with the cathode, the voltage sustaining area is at least partially contiguous with the gate and the unit SCR terminates at the other end with the anode which is at least partially contiguous to the voltage sustaining area.

8. The high voltage SCR switch of claim 7 wherein the two unit SCR's, the first resistor, and the second resistor further comprise:
   a) a substrate with an upper surface, and
   b) a polysilicon layer on the insulating layer wherein the cathode, gate, voltage sustaining area, anode, first resistor, and second resistor are located.

9. A high voltage SCR switch comprising:
   a) an electrical series comprised of n SCRs, one of the unit SCRs, n being an integer of at least 2, each of the unit SCRs being uniquely numbered with an integer between 1 and n, the unit SCR being numbered 1 being a first unit SCR and the unit SCR being numbered n being a last unit SCR, where each unit SCR comprises a cathode, a gate, an anode and a voltage sustaining area, b) a voltage source node, c) n resistors, each of the resistors being uniquely numbered with an integer between 1 and n, the resistors being numbered 1 being a first resistor and the resistor being numbered n being an nth resistor, each resistor having a first end and a second end, and each resistor being associated with a single unit SCR to form a resistor-unit SCR pair such that the first resistor is associated with the first unit SCR to form a first resistor-unit SCR pair and the nth resistor is associated with the last unit SCR to form an nth resistor-unit SCR pair, d) the cathode of the first unit SCR being electrically connected to the first end of the first resistor, e) where i is every integer between 1 and n−1 inclusive, each of the ith unit SCRs having its anode being electrically connected to and at least partially contiguous with the cathode of the (i+1)th unit SCR, and each of the ith resistors having its second end electrically connected to the gate of the (i+1)th unit SCR and electrically connected to the first end of the (i+1)th resistor, and g) the anode of the nth unit SCR being electrically connected to the second end of the nth resistor and the voltage source node.

10. The high voltage SCR switch of claim 9 wherein each unit SCR generally extends linearly and had two ends.

11. The high voltage SCR switch of claim 10 wherein each unit SCR further comprises the cathode, gate, voltage sustaining area, and anode being generally linearly arranged such that the cathode is on one end, the gate is at least partially contiguous with the cathode, the voltage sustaining area is at least partially contiguous with the gate and the unit SCR terminates at the other end with the anode that is at least partially contiguous to the voltage sustaining area.

12. The high voltage SCR switch of claim 11 wherein the two unit SCR's, the first resistor, and the second resistor further comprise:

a) a substrate with an upper surface, and b) a polysilicon layer on the insulating layer wherein the cathode, gate, voltage sustaining area, anode, first resistor, and second resistor are located.

* * * * *